(12) United States Patent
Masuda et al.

(10) Patent No.: US 7,061,178 B2
(45) Date of Patent: Jun. 13, 2006

(54) PLASMA DISPLAY

(75) Inventors: Shinji Masuda, Osaka (JP); Kenji Ogawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 89 days.

(21) Appl. No.: 10/477,459

(22) PCT Filed: Mar. 13, 2003

(86) PCT No.: PCT/JP03/02983

§ 371 (c)(1),
(2), (4) Date: Nov. 12, 2003

(87) PCT Pub. No.: WO03/077272

PCT Pub. Date: Sep. 18, 2003

(65) Prior Publication Data

US 2004/0232838 A1 Nov. 25, 2004

(30) Foreign Application Priority Data

Mar. 14, 2002 (JP) .............................. 2002-069700

(51) Int. Cl.
*H01J 17/49* (2006.01)
(52) U.S. Cl. ...................................... 313/582; 313/583
(58) Field of Classification Search ........ 313/582–587; 361/760, 740, 720, 736; 29/831, 846, 842
See application file for complete search history.

(56) References Cited

U.S. PATENT DOCUMENTS 5,670,994 A * 9/1997 Kawaguchi et al. ........ 345/206
5,710,693 A * 1/1998 Tsukada et al. ............. 361/686

FOREIGN PATENT DOCUMENTS

| JP | 11-162359 | 6/1999 |
| JP | 2000-47636 | 2/2000 |
| JP | 2000-133140 | 5/2000 |

* cited by examiner

*Primary Examiner*—Ashok Patel
*Assistant Examiner*—Anthony Canning
(74) *Attorney, Agent, or Firm*—Wenderoth, Lind & Ponack, L.L.P.

(57) ABSTRACT

In a plasma display device in which a substrate contains a plurality of rows of sustain electrodes and scan electrodes, a terminal lead-out section of sustain electrodes is formed of a structure in which a common connection pattern is disposed at a location other than the effective display area of the panel, which provides all rows of sustain electrodes with a common connection. Furthermore, a plurality of connecting blocks, to which each of a plurality of flexible printed circuits (FPCs) is connected, are arranged at almost the same pitch to establish an electrical connection with the common connection pattern. A terminal lead-out section so structured can minimize differences in luminance on the panel caused by an uneven amount of current flow into the FPCs.

6 Claims, 6 Drawing Sheets

FIG. 7
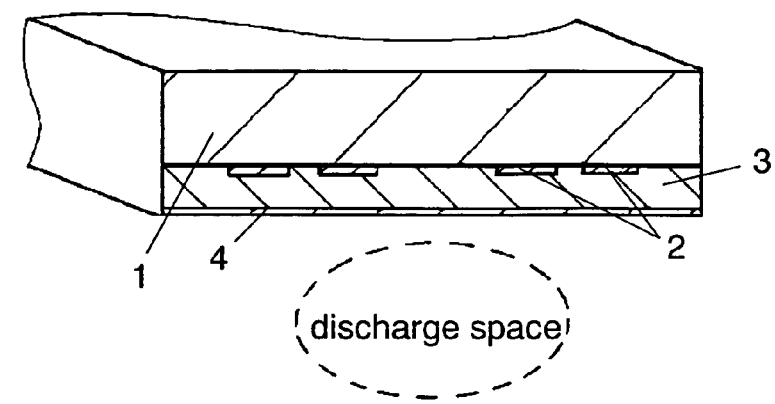
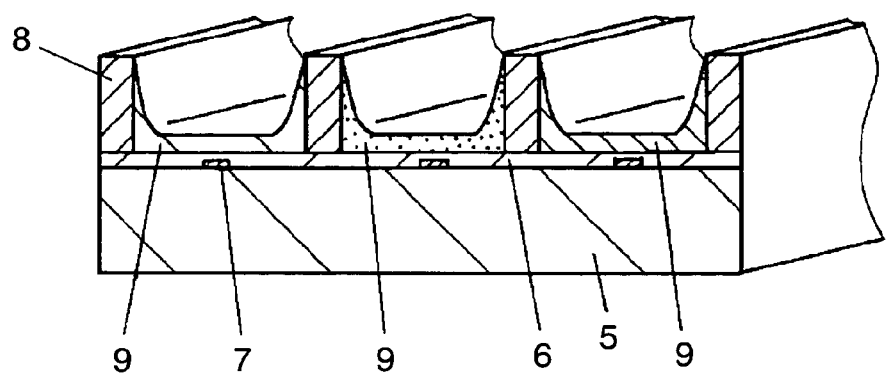
FIG. 8
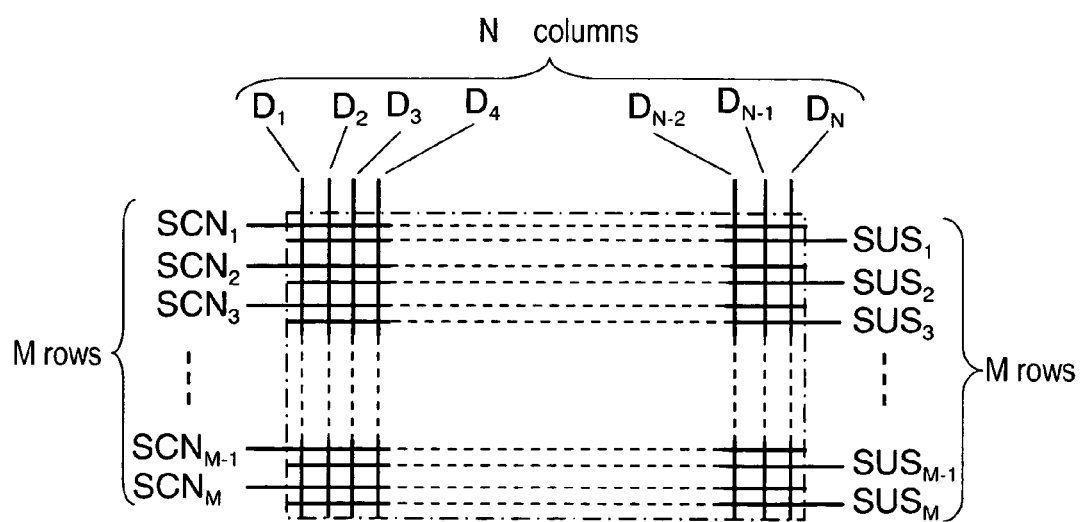

PLASMA DISPLAY

TECHNICAL FIELD

The present invention relates to a plasma display device known as a large, thin, and lightweight display device.

BACKGROUND ART

A plasma display device has recently been drawing attention among the flat panel display technologies. Compared to a liquid crystal display (LCD) panel, a plasma display panel can provide a higher display speed, a larger field of view, easier upsizing in manufacturing, and higher display quality due to its self-emitting characteristic.

To display color images, a plasma display device generally produces ultraviolet rays through gas discharging for exciting phosphors. In the structure of the device, dividing walls partition a discharge space in the panel into a plurality of discharge cells each of which has a phosphor layer.

The plasma display device falls roughly into an alternating current (AC) plasma display device and a direct current (DC) plasma display device according to its operation principle. Also, the plasma display device is divided into a surface discharge type and an opposing discharge type according to configuration of electrodes. In terms of providing high resolution, easy upsizing, and simple manufacturing, today's mainstream is a surface discharge type plasma display device with a three-electrode structure. To be more specific, the device has two substrates opposing each other. One of the substrates has pairs of display electrodes formed of scan electrodes and sustain electrodes arranged in parallel with each other; and the other substrate has address electrodes disposed so as to be orthogonal to the display electrodes on the opposing substrate, dividing walls, and phosphor layers. The aforementioned structure allows the phosphor layer to be relatively thick, providing high quality in color display using phosphors.

Now will be described the structure of a plasma display panel of a plasma display device with reference to FIG. 7. On front-side substrate 1, which is made of glass or other transparent materials, a plurality of pairs of display electrodes 2 formed of scan electrodes and sustain electrodes is arranged in a stripe shape, as shown in FIG. 7. Dielectric layer 3 is disposed so as to cover an array of the electrodes, and over which, protecting film 4 is formed.

On the other hand, on the rear-side substrate 5 facing substrate 1 disposed on the front side, address electrodes 7 are formed into stripes and arranged so as to be orthogonal to display electrodes 2 on substrate 1. Overcoat layer 6 covers the stripes of address electrodes 7. On overcoat layer 6 between address electrodes 7, a plurality of dividing walls 8 is disposed in parallel with the rows of address electrodes 7. Furthermore, phosphor layer 9 is formed between dividing walls 8 and on the surface of overcoat layer 6.

Substrates 1 and 5 are located, via a tiny discharge space, in an opposing arrangement so that display electrodes 2 formed of the scan electrodes and sustain electrodes are generally orthogonal to address electrodes 7, and the opposing sides of the two substrates are sealed with each other. The discharge space formed between substrates 1 and 5 is filled with discharge gas—the gas may be any one of Helium, Neon, Argon, Xenon, or mixture of them. Dividing wall 8 divides the discharge space into a plurality of cells, that is, a plurality of discharge cells are formed at intersections of display electrodes 2 and address electrodes 7. Phosphor layer 9 is disposed one by one in each cell so as to have a successive order of the red, green, and blue phosphors.

FIG. 8 shows an arrangement of the electrodes disposed on a plasma display panel. The pairs of the scan electrodes and the sustain electrodes, and the address electrodes are, as shown in FIG. 8, arranged into a matrix with M (rows) by N (columns); the structure has M scan electrodes (SCN1–SCNM) and M sustain electrodes (SUS1–SUSM) in the row directions of the matrix, on the other hand, has N address electrodes (D1–DN) in the column directions of the matrix (see Japanese Patent Laid-Open Application No. 2000-47636).

When an image is displayed on such a plasma display panel, first, a voltage pulse (writing pulse) is applied between the address electrode and the scan electrode defining the selected cell for address discharge. Then, a sustaining pulse having a periodic phase-reverse is applied between the scan electrode and the sustain electrode for sustain discharge.

Terminal lead-out sections of the sustain electrodes are divided into plural connection blocks according to the number of terminals disposed on one flexible printed circuit (hereinafter referred as an FPC). Each lead-out section of the sustain electrodes connects with an FPC at each connection block.

When the waveform for driving the sustain electrodes has a fixed form, a solid pattern is provided on the copper foil section of each FPC to avoid waveform distortion due to undesired impedance and inductance.

In the plasma display device structured above, however, variations in the current flow into the FPCs for driving the sustain electrodes have caused a problem. Now, suppose that a plasma display panel has a structure in which evenly divided sustain electrodes in the discharge area are connected with 6FPCs. When the panel displays an image—suppose that the uppermost one-twelfth of the effective display area of the panel is colored in black, and the rest of the area is in white. In this case, the FPC located in the uppermost section of the panel has a small current flow and therefore the loss in driving waveform voltage decreases at the section. This increases practical voltage to the discharge cell corresponding to the uppermost FPC, that is, the uppermost section has higher luminance than other cells in the panel. As described above, the inconsistencies in luminance have been a problem in the prior-art structure.

DISCLOSURE OF THE INVENTION

The present invention addresses the aforementioned problem. It is therefore the object to provide a plasma display device capable of eliminating inconsistencies in luminance due to the connection on the side of the sustain electrodes.

To achieve the object above, the plasma display device of the present invention has an improved terminal lead-out section of the sustain electrodes; the lead-out section contains i) a common connection pattern for providing all the sustain electrodes arranged in plural rows with a common connection at a section other than the effective display area in the panel, and ii) a plurality of connection blocks that are connected to the common connection pattern, and each FPC is connected thereto. The connection blocks are located at almost the same pitches.

The aforementioned structure—in which all the sustain electrodes of the panel are connected at a section close to the connection blocks to which the FPCs are connected, and in which the connection blocks are arranged so as to have nearly the same pitches—allows each FPC to have almost the same amount of current flow. The consistency in current distribution can suppress the difference in waveform distortion caused by changes in apparent impedance and inductance in the pattern of the copper foil section in an FPC.

BRIEF DESCRIPTION OF THE DRAWINGS

FIG. 7 is a perspective view illustrating the general structure of the panel of a plasma display device.

FIG. 8 illustrates the electrode arrangement in the panel of the plasma display device.

DETAILED DESCRIPTION OF CARRYING OUT OF THE INVENTION

An exemplary embodiment of the present invention is described hereinafter with reference to the accompanying drawings, FIG. 1 through FIG. 6. However, it is to be understood that the present invention is not limited to the embodiment.

Figure 1:
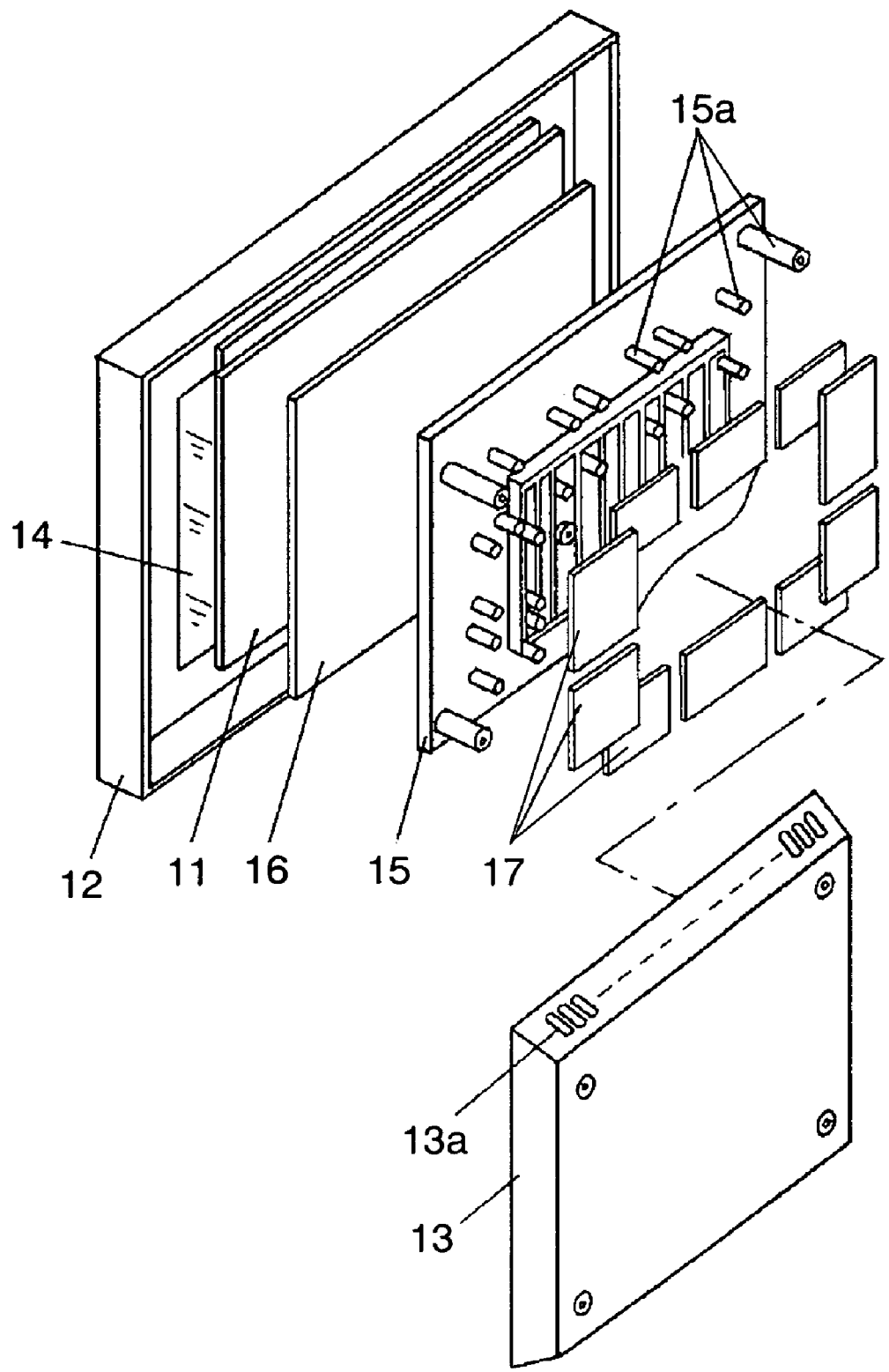
FIG. 1 is an exploded perspective view showing the whole structure of a plasma display device in accordance with an exemplary embodiment of the present invention.

FIG. 1 shows an example of the entire structure of a plasma display device. The structure of panel 11 in FIG. 1 is illustrated in FIGS. 7 and 8. The housing that accommodates panel 11 therein is formed of front frame 12 and metallic back cover 13. The opening of front frame 12 has front cover 14, which is made of glass or the like, as a protector of an optical filter and panel 11. Against undesired radiation of electromagnetic wave, for example, silver deposition is provided on front cover 14. On the other hand, back cover 13 has a plurality of vent holes 13a for dissipating heat generated from panel 11 into the outside.

Panel 11 is secured in such a way that heat-transfer sheet 16 is bonded to the front surface of chassis member 15 that is made of aluminum and the like. The rear side of chassis member 15 has a plurality of circuit blocks 17 for driving panel 11. Heat-transfer sheet 16 transfers heat from panel 11 to chassis member 15, enhancing heat dissipation. Circuit blocks 17 have electrical circuits for governing display operations of panel 11, which are electrically connected to electrode lead-out sections disposed at the edge of panel 11 through a plurality of FPCs (not shown) extending over the four ends of chassis member 15.

In addition to circuit blocks 17, the rear surface of chassis member 15 has rearwardly extending boss 15a for fixing back cover 13, which is formed by integral molding such as die-casting. Chassis member 15 can be formed of an aluminum flat plate on which fixed pins are firmly disposed.

Figure 2:
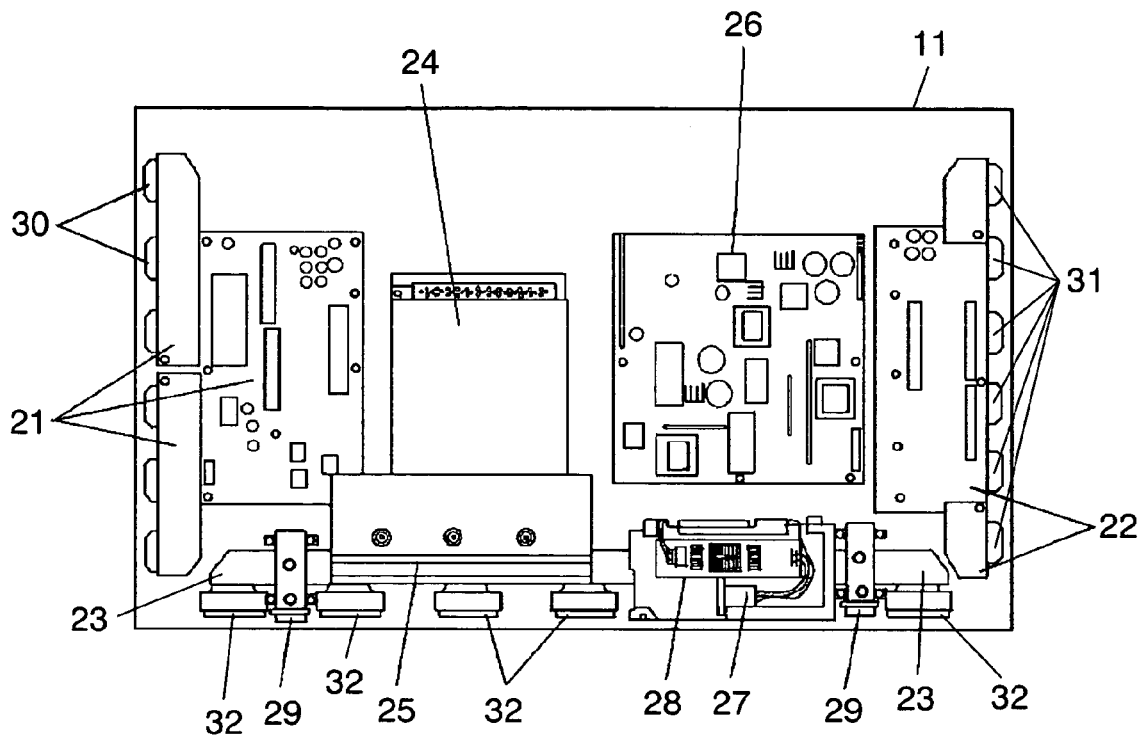
FIG. 2 is a plan view showing an example of the arrangement in the interior of the plasma display device.

FIG. 2 is a plan view showing the interior, with back cover 13 removed, of the plasma display device structured above. In the figure, scan electrode-driving circuit block 21 as the driver of the scan electrodes applies a signal voltage to the scan electrodes of panel 11. Similarly, sustain electrode-driving circuit block 22 as the driver of the sustain electrodes applies a signal voltage to the sustain electrodes. Furthermore, address electrode-driving circuit block 23 as the driver of the address electrodes applies a signal voltage to the address electrodes. Scan electrode-driving circuit block 21 and sustain electrode-driving circuit block 22 are located at each of widthwise both ends of chassis member 15. Address electrode-driving circuit block 23 is disposed at the bottom section in the vertical direction of chassis member 15.

Input signal circuit block 25 has an input terminal section to which a connecting cable for external equipment including a television tuner is removably connected. In response to an image signal fed from circuit block 25, control circuit block 24 converts image data into an image data signal according to the number of pixels of panel 11 and then feeds the data signal to address electrode-driving circuit block 23. At the same time, control circuit block 24 generates a discharge-control timing signal and feeds the signal to scan electrode-driving circuit block 21 and scan electrode-driving circuit block 22, thereby controlling display operations such as gradation control. Circuit block 24 is disposed at nearly the center of chassis member 15.

Power supply block 26 for applying voltage to each of the circuit blocks is located at a mid section of chassis member 15, as well as control circuit block 24. Through power input block 28 having connector 27 to which a power cable (not shown) is attached, commercial power supply voltage is provided to power block 26.

Brackets 29—for fixing the panel to a stand pole—are disposed at the bottom section of chassis member 15 in the vertical direction. To attach the panel to a stationary stand, the tip of the stand pole of the stand is inserted in the hole of bracket 29 and then the stand pole is secured to bracket 29 with screws or the like. In this way, the panel can be held in upright position.

FPC 30 connects between the lead-out section of the scan electrodes of panel 11 and the printed circuit board of scan electrode-driving circuit block 21, similarly, FPC 31 connects between the lead-out section of the sustain electrodes of panel 11 and the printed circuit board of sustain electrode-driving circuit block 22. FPC 32 connects between the lead-out section of the address electrodes of panel 11 and the printed circuit board on which the address electrode-driving circuit is mounted. Each FPC is turned around from the front side to the rear side, through the corresponding edge where the FPC is disposed, of panel 11.

Figure 3:
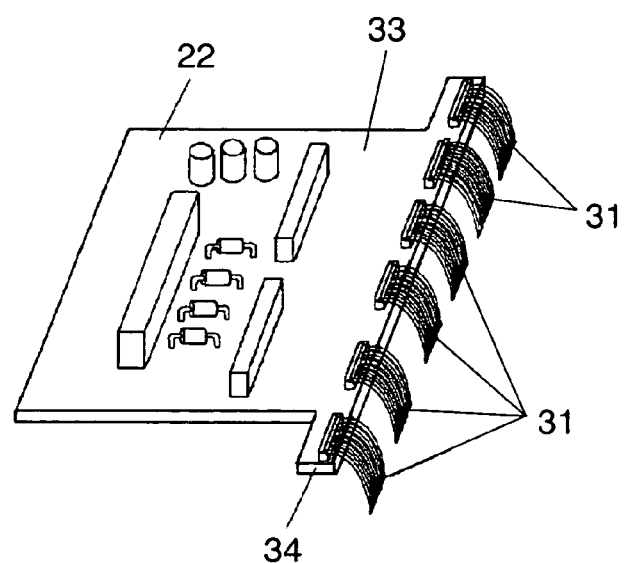
FIG. 3 is a perspective view illustrating the essential part of the plasma display device

FIG. 3 shows an enlarged view of the sustain electrode-driving circuit block of FIG. 2. In sustain electrode-driving circuit block 22, as shown in FIG. 3, substrate 33 has a plurality of connectors 34 to which each FPC 31 is connected. FPCs 31 make connection with the circuit pattern of the substrate such that one end of each FPC is inserted into corresponding connector 34, and the other end is connected to the terminal lead-out section of the sustain electrodes. Besides, on the application of driving voltage to the sustain electrodes, waveform distortion due to the circuit elements or the copper foil disposed on the substrate can occur. To minimize the distortion, the copper foil (not shown), which is a conductive pattern for applying waveform voltage to all of the pin terminals of connectors 34, is formed as a common pattern with a broadened width, i.e., a solid pattern so as to bundle the output from a plurality of elements into one.

Figure 4:
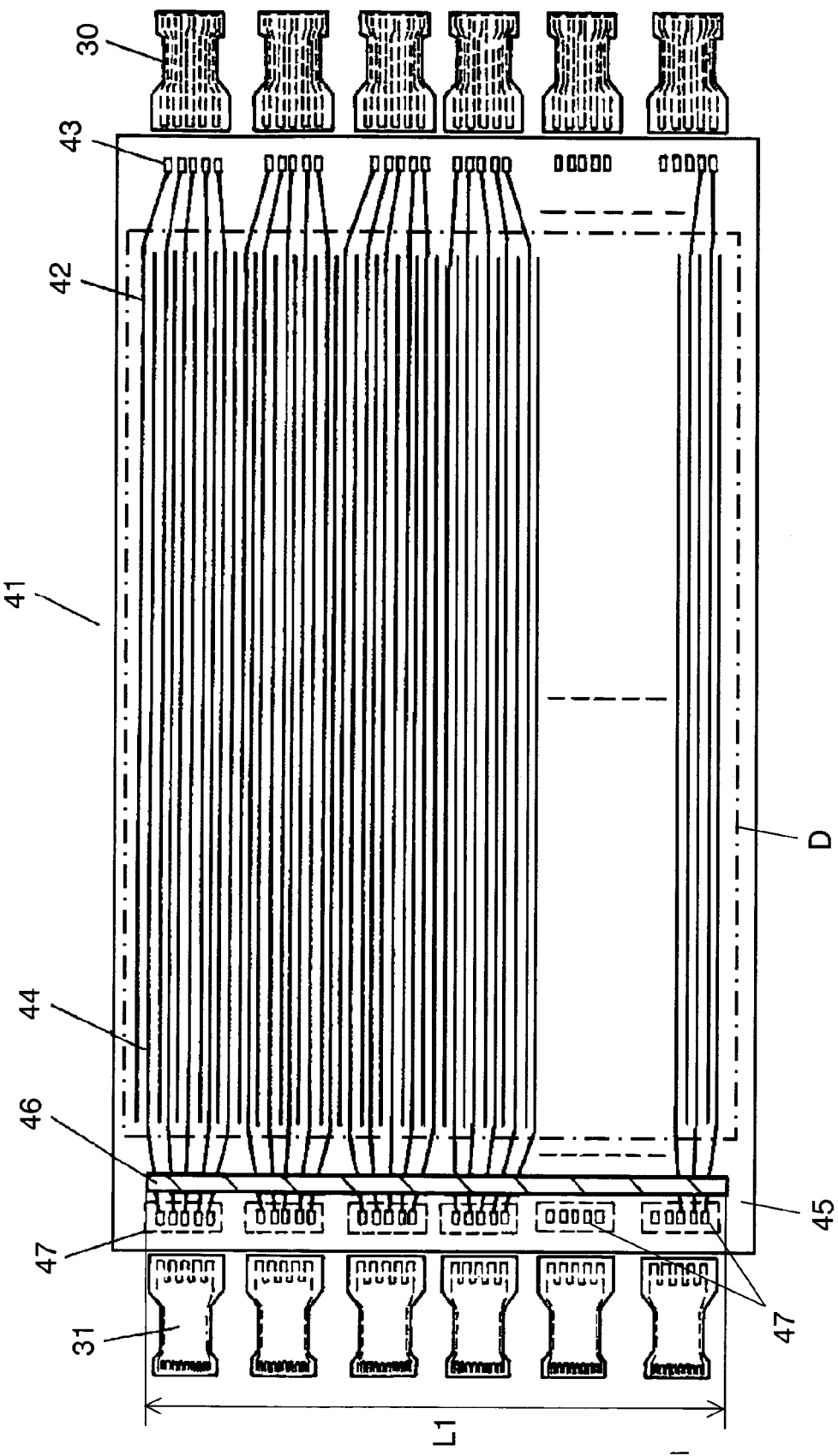
FIG. 4 is a plan view showing the general structure of the plasma display device.

FIG. 4 illustrates the front substrate of panel 11. Panel 11 has, as shown in FIG. 7, opposing two substrates via the discharge space. One of the substrates has a plurality of rows of the sustain electrodes and the scan electrodes in parallel with each other, while on the other of the substrate, a plurality of rows of the address electrodes are located so as to be orthogonal to the sustain electrodes and the scan electrodes on the opposing substrate. The structure forms a plurality of discharge cells at each intersection of the electrodes.

In FIG. 4, numeral 41 indicates the front substrate of panel 11; numeral 42 indicates a scan electrode; numeral 43 indicates a terminal lead-put section of scan electrode 42; numeral 44 indicates a sustain electrode; and numeral 45 indicates a terminal lead-out section of sustain electrode 44. Each FPC 31 has a plurality of connecting terminals, each of which connects with corresponding terminal lead-out section 45 of sustain electrodes 44. In the film of each FPC, however, the pattern is formed as a copper foil-made pattern with a broadened width, i.e., a solid pattern to offer common connection.

Terminal lead-out section 45 of sustain electrode 44 contains i) common connection pattern 46 that provides all of sustain electrodes 44 having plural rows with common connection at a section other than effective display area D in panel 11, and ii) a plurality of connection blocks 47 connected to common connection pattern 46, and to which, FPCs 31 are connected. Connection blocks 47 are formed of a plurality of blocks corresponding to the number of the terminals disposed in each FPC 31. Besides, common connection pattern 46 is a thin film of silver (Ag) to decrease impedance and inductance. With the structure above, all of sustain electrodes 44 arranged in effective display area D of front substrate 41 are commonly connected at a section other than area D on the shorter sides of panel 11.

Suppose that "L1" represents the length of common connection pattern 46 of panel 11; L2 represents the length of a shorter side of panel 11 on which terminal lead-out section 45 is disposed; and "N" represents the number of connection blocks 47. The plurality of connection blocks 47 is arranged at pitches that satisfy the expression of $L1/N \pm (L2-L1)/N$. Each FPC 31 is connected with corresponding connection block 47 to electrically connect to the sustain electrode-driving circuit block. The length "L2" of the shorter side of the panel on which terminal lead-out section 45 is disposed represents a substantial length, with the components forming panel 11 have been disposed—expressed differently, "L2" indicates the length between the upper-end position and the lower-end position of the dividing walls disposed on the back substrate, or the length between the upper-end position and the lower-end position of the discharge space between the front and back substrates, when the panel is viewed in its lengthwise direction.

A prototype with the aforementioned structure was built as a 42-in. plasma display panel, which contains the discharge cells of 480×852×3 (R, G, B). In the panel, common connection pattern 46 with dimensions of 49.5 cm (in length) by 0.4 cm (in width) was disposed on terminal lead-out section 45 of sustain electrodes 44, and six connection blocks 47 were disposed at pitches of 8.6 cm. The length of the shorter side of panel 11 was determined to 51.8 cm. It will be understood that the pitch length of 8.6 cm between connection blocks 47 satisfies the expression of $L1/N \pm (L2-L1)/N$, that is, $49.5/6 \pm (51.8-49.5)/6 = 8.25 \pm 0.38$.

Figure 5:
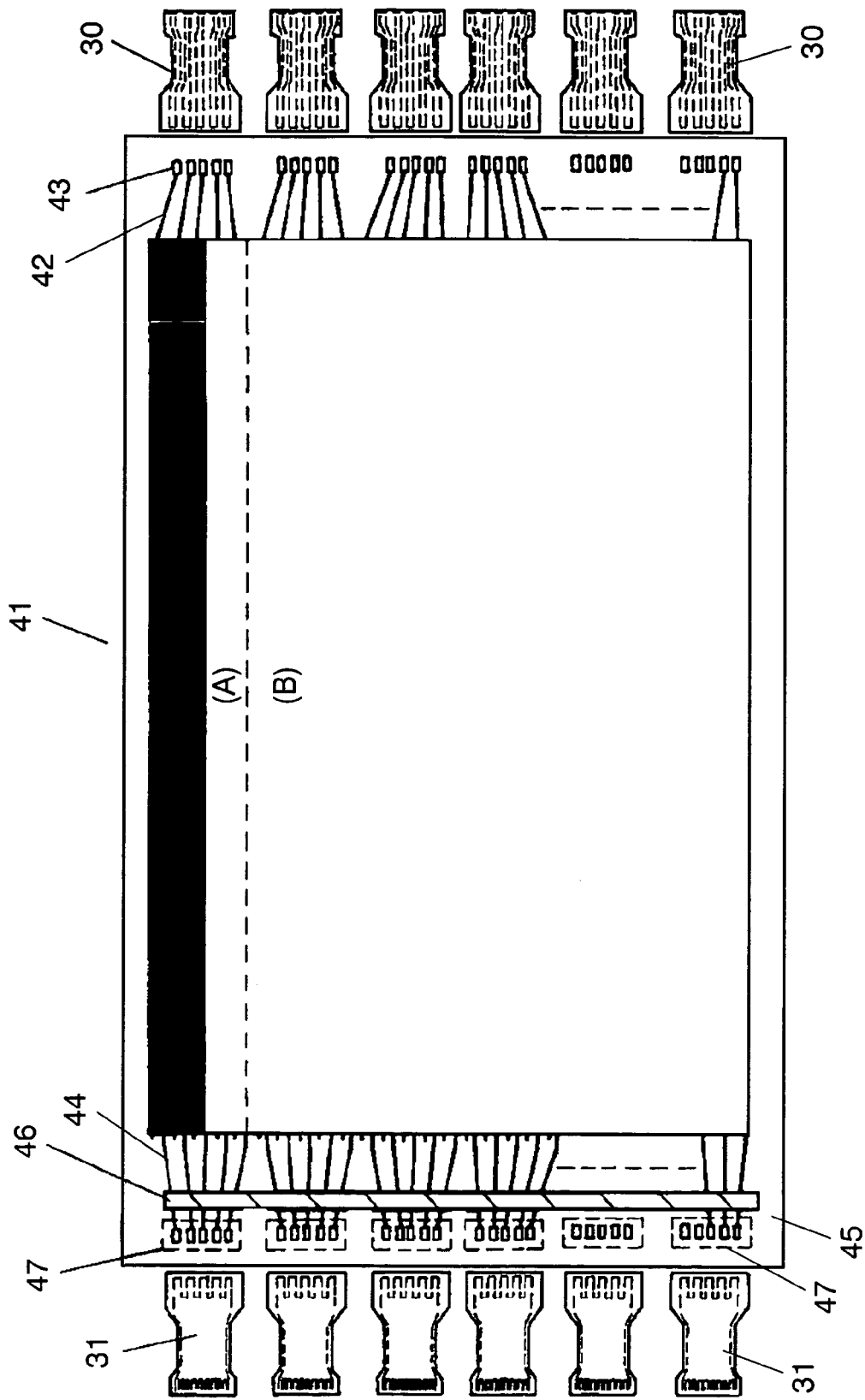
FIG. 5 is a plan view showing an image pattern for evaluation in a plasma display device.

An image pattern, in which the topmost one-twelfth of the effective display area is colored by black and the rest of the area is in white, was displayed on the prototype panel, as shown in FIG. 5. The experiment found that up-to-0.6A current out of the amount of current that has conventionally flown in lower five FPCs 31 was provided into topmost FPC 31. As a result, the driving voltage waveform observed at connection block 47 of topmost FPC 31 has the same shape as that observed at other FPCs 31.

Figure 6:
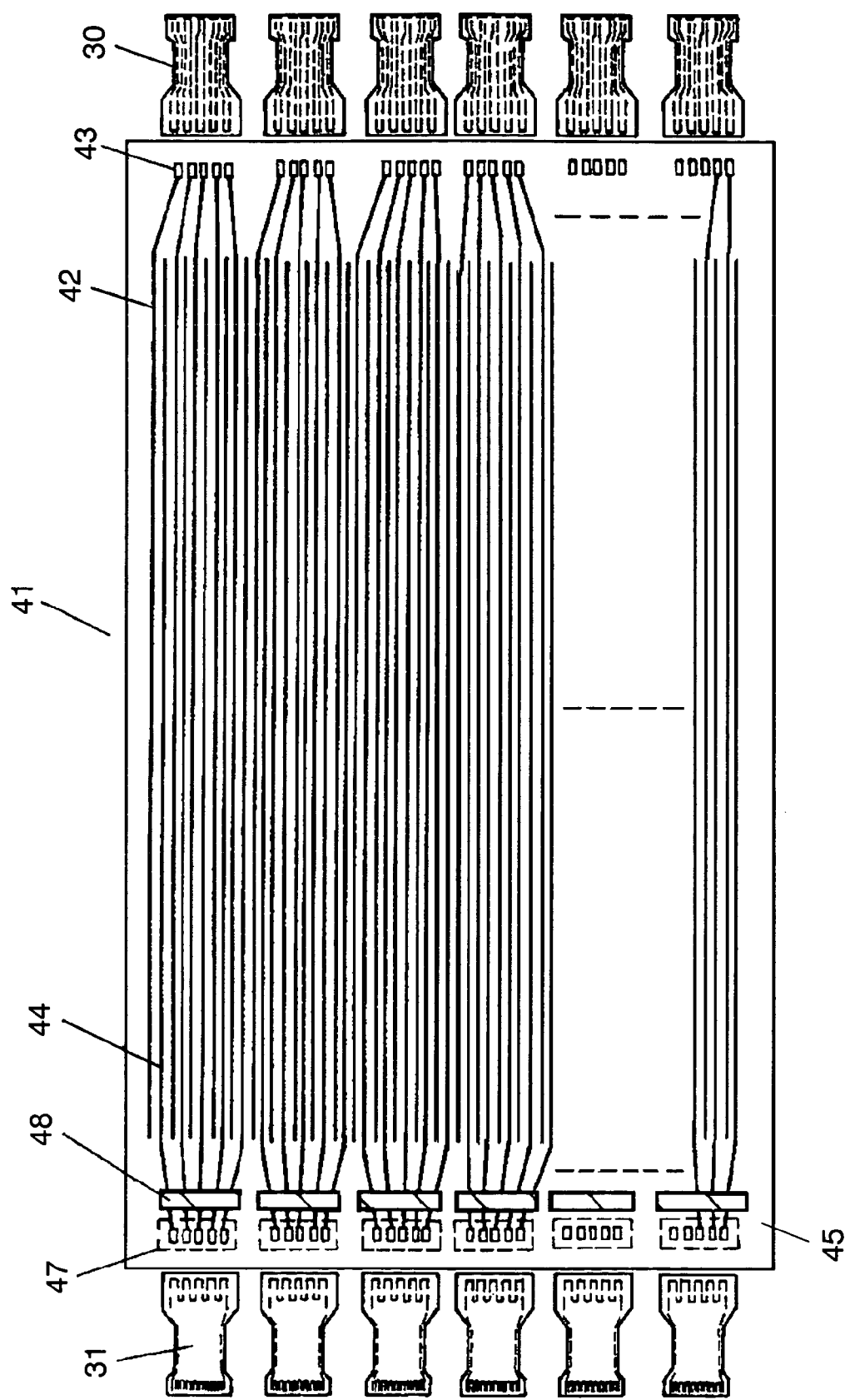
FIG. 6 illustrates the structure of the front substrate of a prior-art plasma display device.

Another panel with no common connection pattern, as shown in FIG. 6, was prepared as a comparative sample and compared to the structure of the present invention in terms of difference in luminance. In the panel of FIG. 6, observation section A has luminance of 137.7 cd/m$^2$, while observation section B has luminance of 140.7 cd/m$^2$. That is, section A has a luminance 4.5% higher than that of section B. Numeral 48 in FIG. 6 indicates the connection block pattern corresponding to each FPC 31.

In contrast, the structure of the present invention achieved a luminance of 137.7 cd/m$^2$ at observation section B, and achieved a luminance of 138.7 cd/m$^2$ at observation section A. The difference between the two sections is only 1 cd/m2, which is a slight increase of 0.7% with respect to the measurement at section B. According to an experiment, the human eyes usually can tell, at a glance, a difference in luminance larger than 3.5% between two objects. Therefore, the structure with a slight difference of 0.7% can provide a substantially "luminance difference-free" plasma display device.

Table 1 shows an example of the structure of the plasma display panel, where L1 indicates the length of common connection pattern 46, L2 indicates the length of the shorter side of a panel on which the terminal lead-out section is disposed, and N indicates the number of the connection blocks.

TABLE 1

| Panel size (in.) | The number of the lines | L1 (cm) | L2 (cm) | N (the number of the blocks) |
|---|---|---|---|---|
| 37 | 480 | 46.10 | 45.75 | 6 |
| 42 | 480 | 49.50 | 51.80 | 6 |
|  | 768 | 50.75 | 51.80 | 8 |
| 50 | 768 | 62.00 | 62.20 | 8 |

Table 2 below shows pitch ranges of the FPCs derived from the expression according to the present invention, and actual measurements of the pitches between the FPCs of the plasma display panel of the present invention.

TABLE 2

| Panel size (in.) | L1/N (cm) | (L2 − L1)/N (cm) | Pitch ranges (cm) | Actual measurements of pitches (cm) |
|---|---|---|---|---|
| 37 | 7.68 | −0.06 | 7.63–7.74 | 7.7 |
| 42 | 8.25 | 0.38 | 7.87–8.63 | 8.6 |
|  | 6.34 | 0.13 | 6.21–6.48 | 6.3 |
| 50 | 7.53 | 0.25 | 7.28–7.78 | 7.7 |

In all of the plasma display panels listed in Table 2, difference in luminance between observation sections A and B achieved preferable results—less than 3.5%.

According to the present invention, as described above, terminal lead-out section 45 contains i) common connection pattern 46 that provides all of sustain electrodes 44 having plural rows with a common connection at a section other than the effective display area in panel 11, and ii) a plurality of connection blocks 47 connected to common connection pattern 46, and to which, each FPC 31 is connected. Disposing connection blocks 47 at substantially the same pitches can provide almost even amount of current to each FPC 31 connected to sustain electrodes 44. The even current distribution can minimizes the difference in the distortion amount of a waveform due to changes in impedance and inductance, thereby enhancing the consistency in luminance in a plasma display device. In particular, the aforementioned advantage is noticeable when the pitch between connection blocks 47 is determined from the expression: $L1/N\pm(L2-L1)/N$, where L1 indicates the length of common connection pattern 46, L2 indicates the length of a short side of a panel on which the terminal lead-out section is disposed, and N indicates the number of the connection blocks.

Although a thin Ag film is employed for common connection pattern 46 in the description above, it is not limited thereto.

INDUSTRIAL APPLICABILITY

The plasma display device of the present invention, as described above, can minimize the difference in luminance, which has been a pending problem, due to uneven amount of current flowing into the FPCs on the side of the sustain electrodes.

The invention claimed is:

1. A plasma display device comprising:
   a panel including a plurality of substrates;
   a plurality of rows of sustain electrodes and scan electrodes on one of said substrates;
   a terminal lead-out section on said one of said substrates at a location on one side of said panel and outside an effective display area of said panel;
   a driving circuit of said sustain electrodes;
   a plurality of printed circuit boards electrically connected to said terminal lead-out section and said driving circuit;
   wherein said terminal lead-out section comprises:
      a common connection pattern connected to each printed circuit board, and providing all of said sustain electrodes with a common connection at the location outside the effective display area of said panel; and
      a plurality of connection blocks connected to said common connection pattern, and being located at a pitch which is determined to satisfy an expression $L1/N\pm(L2-L1)/N$, where L1 indicates a length of said common connection pattern, L2 indicates a length of a short side of said panel on which said terminal lead-out section is disposed, and N indicates the number of said connection blocks.

2. The plasma display device of claim 1, wherein said common connection pattern is made of silver (Ag).

3. The plasma display device of claim 1, wherein said printed circuit boards are flexible printed circuit boards.

4. A plasma display device comprising:
   a panel including a plurality of substrates;
   a plurality of rows of sustain electrodes and scan electrodes on one of said substrates;
   a terminal lead-out section on said one of said substrates at a location on one side of said panel and outside an effective display area of said panel;
   a driving circuit of said sustain electrodes, said driving circuit including a substrate with a solid-pattern conductive pattern;
   a plurality of printed circuit boards electrically connected to said terminal lead-out section and said conductive pattern of said driving circuit;
   wherein said terminal lead-out section comprises:
      a common connection pattern connected to each printed circuit board, and providing all of said sustain electrodes with a common connection at the location outside the effective display area of said panel; and
      a plurality of connection blocks connected to said common connection pattern, and being located at a pitch which is determined to satisfy an expression $L1/N\pm(L2-L1)/N$, where L1 indicates a length of said common connection pattern, L2 indicates a length of a short side of said panel on which said terminal lead-out section is disposed, and N indicates the number of said connection blocks.

5. The plasma display device of claim 4, wherein said common connection pattern is made of silver (Ag).

6. The plasma display device of claim 4, wherein said printed circuit boards are flexible printed circuit boards.

* * * * *

UNITED STATES PATENT AND TRADEMARK OFFICE
CERTIFICATE OF CORRECTION

| | | |
|---|---|---|
| PATENT NO. | : 7,061,178 B2 | Page 1 of 1 |
| APPLICATION NO. | : 10/477459 | |
| DATED | : June 13, 2006 | |
| INVENTOR(S) | : Shinji Masuda et al. | |

It is certified that error appears in the above-identified patent and that said Letters Patent is hereby corrected as shown below:

Column 7,

Line 21, "substrates:" should read --substrates;--.

Signed and Sealed this

Second Day of January, 2007

JON W. DUDAS
*Director of the United States Patent and Trademark Office*